United States Patent
Cheng et al.

(10) Patent No.: US 11,145,677 B2
(45) Date of Patent: Oct. 12, 2021

(54) FULLY DEPLETED SEMICONDUCTOR-ON-INSULATOR TRANSISTORS WITH DIFFERENT BURIED DIELECTRIC LAYER CHARGES AND DIFFERENT THRESHOLD VOLTAGES

(71) Applicant: INTERNATIONAL BUSINESS MACHINES CORPORATION, Armonk, NY (US)

(72) Inventors: Kangguo Cheng, Schenectady, NY (US); Shawn P. Fetterolf, Cornwall, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 68 days.

(21) Appl. No.: 16/691,734

(22) Filed: Nov. 22, 2019

(65) Prior Publication Data
US 2020/0098791 A1    Mar. 26, 2020

Related U.S. Application Data

(62) Division of application No. 16/126,212, filed on Sep. 10, 2018, now Pat. No. 10,629,620.

(51) Int. Cl.
*H01L 27/01* (2006.01)
*H01L 27/12* (2006.01)
*H01L 31/0392* (2006.01)
*H01L 29/06* (2006.01)
*H01L 21/84* (2006.01)
(Continued)

(52) U.S. Cl.
CPC .... *H01L 27/1203* (2013.01); *H01L 21/02164* (2013.01); *H01L 21/31053* (2013.01); *H01L 21/7624* (2013.01); *H01L 21/84* (2013.01); *H01L 29/0649* (2013.01); *H01L 21/31111* (2013.01); *H01L 21/31144* (2013.01);
(Continued)

(58) Field of Classification Search
CPC ......... H01L 21/02164; H01L 21/31053; H01L 21/31111; H01L 21/31144; H01L 21/7624; H01L 21/823462; H01L 21/84; H01L 27/1203; H01L 29/0649; H01L 29/0847; H01L 29/167; H01L 29/36
USPC ....................................................... 257/348
See application file for complete search history.

(56) References Cited

U.S. PATENT DOCUMENTS 8,309,447 B2    11/2012    Cheng et al.
8,552,500 B2    10/2013    Dennard et al.
(Continued)

OTHER PUBLICATIONS

Paper, by Khater et al. entitled, "FDSOI CMOS with Dielectrically-Isolated Back Gates and 30nm LG High-κ/Metal Gate", published in the 2010 Symposium on VLSI Technology Digest of Technical Papers, pp. 43-44.
(Continued)

*Primary Examiner* — Theresa T Doan
(74) *Attorney, Agent, or Firm* — Cantor Colburn LLP; Randall Bluestone

(57) ABSTRACT

According to embodiments of the present invention, a semiconductor device includes a first transistor located on a first fixed charge dielectric layer and a second transistor located on a second fixed charge dielectric layer. The first fixed charge dielectric layer and the second fixed charge dielectric layer are differently charged such that the first transistor and the second transistor have different threshold voltages.

18 Claims, 2 Drawing Sheets

(51) Int. Cl.
  *H01L 21/762*    (2006.01)
  *H01L 21/3105*  (2006.01)
  *H01L 21/02*    (2006.01)
  H01L 29/167   (2006.01)
  H01L 21/311   (2006.01)
  H01L 29/08    (2006.01)
  H01L 29/36    (2006.01)

(52) U.S. Cl.
  CPC ........ *H01L 29/0847* (2013.01); *H01L 29/167* (2013.01); *H01L 29/36* (2013.01)

(56) References Cited

U.S. PATENT DOCUMENTS

| | | |
|---|---|---|
| 8,575,699 B2 | 11/2013 | Chan et al. |
| 8,816,417 B2 | 8/2014 | Jeon et al. |
| 8,865,539 B2 | 10/2014 | Chen et al. |
| 2010/0038724 A1* | 2/2010 | Anderson ............. H01L 29/517 257/392 |
| 2018/0047642 A1 | 2/2018 | Thees et al. |
| 2018/0082889 A1* | 3/2018 | Steinmann ........ H01L 21/02321 |

OTHER PUBLICATIONS

List of IBM Patents or Patent Applications Treated as Related; Date Filed: Nov. 22, 2019, 2 pages.
Kangguo Cheng et al., "Fully Depleted Semiconductor-On-Insulator Transistors With Different Buried Dielectric Layer Charges and Different Threshold Voltages", U.S. Appl. No. 16/126,212, filed Sep. 10, 2018.

* cited by examiner

FULLY DEPLETED SEMICONDUCTOR-ON-INSULATOR TRANSISTORS WITH DIFFERENT BURIED DIELECTRIC LAYER CHARGES AND DIFFERENT THRESHOLD VOLTAGES

DOMESTIC PRIORITY

This application is a divisional of U.S. patent application Ser. No. 16/126,212, filed Sep. 10, 2018, the disclosure of which is incorporated by reference herein in its entirety.

BACKGROUND

The present invention relates in general to fabrication methods and resulting structures for semiconductor devices. More specifically, the present invention relates to fabrication methods and resulting structures for providing at least two fully depleted silicon on insulator (FDSOI) transistor devices each having its buried dielectric charge and threshold voltage different from the other.

Fully depleted silicon on insulator (FDSOI) technology utilizes a very thin film located between the gate and the buried oxide layer ensuring that the depletion region spans the entire region between the source and the drain. By construction, there is no need to add a dopant to the thin film ultimately resulting in a reduced threshold voltage. In order to produce competitive electronic devices though, semiconductor chips with different regions is desired. For example, an existing challenge in FDSOI technology is that forming transistors with voltage threshold control has proved difficult.

One solution to incorporate voltage threshold control into FDSOI technology includes incorporating back gates with different dopants. In this case, independent back gate control for nFET and pFET requires junction isolation. However, heavy doping in the back gate is required to minimize depletion effects and maintain voltage threshold control. Therefore, with ground rule scaling, junction leakage between heavily doped back gates is expected to increase, limiting the back bias range to minimize the PN junction leakage current. Shallow-trench-isolations have been formed in between neighboring transistors in order to prevent junction leakage, but such techniques add significant complexity and cost to the fabrication of the component.

An improved FDSOI transistor device with voltage threshold control is therefore desired.

SUMMARY

According to an embodiment of the present invention, a semiconductor device includes a first transistor located on a first fixed charge dielectric layer and a second transistor located on a second fixed charge dielectric layer. The first fixed charge dielectric layer and the second fixed charge dielectric layer are differently charged such that the first transistor and the second transistor have different threshold voltages.

According to an embodiment of the present invention, a method of forming a semiconductor device includes depositing a first fixed charge dielectric layer on a semiconductor layer. A portion of the first fixed charge dielectric layer is removed to form an open area. A second fixed charge dielectric layer is deposited on the open area. A first transistor is formed on top of the first fixed charge dielectric layer and a second transistor is formed on top of the second fixed charge dielectric layer. The first fixed charge dielectric layer and the second fixed charge dielectric layer are differently charged such that the first transistor and the second transistor have different threshold voltages.

BRIEF DESCRIPTION OF THE DRAWINGS

FIGS. 2-5 depict fabrication operations for forming selected portion of the semiconductor devices shown in FIG. 1, in which:

FIG. 2 is a cross-sectional view of an initial semiconductor structure after deposition of a first fixed charge dielectric layer according to embodiments of the invention;

FIG. 3 is a cross-sectional view of the semiconductor structure after removal of a portion of the first fixed charge dielectric layer according to embodiments of the invention;

FIG. 4 is a cross-sectional view of the semiconductor structure after deposition of a second fixed charge dielectric layer according to embodiments of the invention; and FIG. 5 is a cross-sectional view of the semiconductor structure after planarization of the first fixed charge dielectric layer and the second fixed charge dielectric layer according to embodiments of the invention.

DETAILED DESCRIPTION

Figure 1:
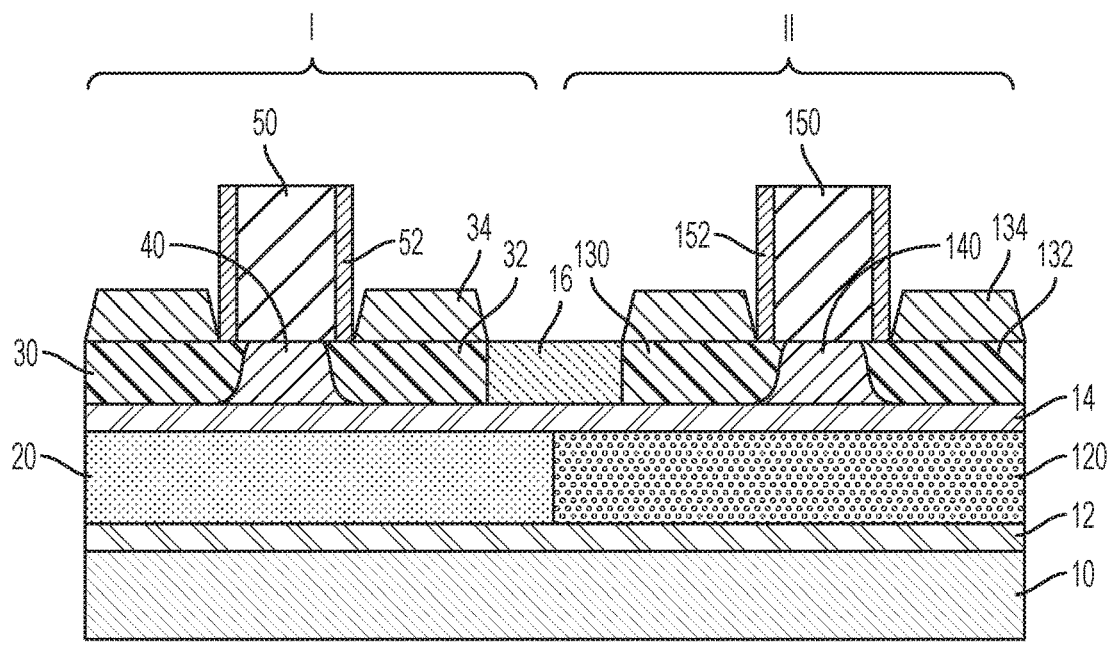
FIG. 1 is a cross-sectional view of a configuration of two FDSOI semiconductor devices fabricated according to embodiments of the invention.

It is understood in advance that, although this description includes a detailed description of the formation and resulting structures for a specific architecture, implementation of the teachings recited herein are not limited to a particular type of integrated circuit architecture. Rather embodiments of the present invention are capable of being implemented in conjunction with any other type of FET or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Integrated circuits (ICs) can include field effect transistors (FETs) that can be operated in a switched mode, where these devices can exhibit a highly conductive state (on-state) and a high impedance state (off-state). The state of the FET can be controlled by a gate electrode, which controls, upon application of an appropriate control voltage, the conductivity of a channel region formed between a drain region and a source region. In an IC having a plurality of metal oxide semiconductor FETs (MOSFETs), each MOSFET's source region and drain region are formed in an active region of a semiconductor layer by incorporating n-type or p-type impurities in the semiconductor layer material. A conventional geometry for MOSTFETs is known as a planar device geometry in which the various parts of the MOSFET device are laid down as planes or layers.

In order to connect the circuit elements formed in the semiconductor material with the metallization layers, a vertical contact structure can be provided having a first end that can be connected to a respective contact region of a circuit element, such as one or both of a gate electrode and the drain and source regions of transistors, and a second end that can be connected to a respective metal line in the metallization layer by a conductive via.

In some applications, the second end of the contact structure can be connected to a contact region of a further semiconductor-based circuit element, in which case the interconnect structure in the contact level can also be referred to as a local interconnect. The contact structure can include contact elements having a generally square-like or rounded shape that can be formed in an interlayer dielectric material, which in turn encloses and passivates the circuit elements.

FDSOI is a MOSFET fabrication technology that provides the benefits of reduced size while enabling a simplification of the fabrication process. FDSOI does not change the fundamental geometry of the MOSFET. However, a distinguishing feature of FDSOI technology is the addition of a thin layer of insulator called the buried oxide (BOX) layer, which is positioned just below an ultra-thin body/layer of silicon that forms the channel. This FDSOI channel configuration is often referred to as ultra-thin body and BOX (UTBB). The BOX layer eliminates the need to add dopants to the channel, thus making the channel "fully depleted." The result is that the gate of an FDSOI transistor very tightly controls the full volume of the transistor body. A feature of FDSOI transistors is the ability to implant a back-gate contact in the silicon substrate, wherein the BOX layer and the back-gate contact form, in effect, a transistor back-gate that can be biased in order to shift the FDSOI transistor's threshold voltage $V_T$.

This invention provides a CMOS device having FDSOI transistors with different voltage thresholds by using different dielectric materials below the FDSOI channel. The different dielectric materials have different fixed charges. As used herein the term "fixed charge" refers to the material having a charge that is not mobile, for example, as would be the case with the addition of a p-type or n-type dopant. As used herein, the fixed charge can refer to, for example, the material having a relative polarity due to molecular orientation or an overabundance of a positively or a negatively charged atom in a molecular structure that constitutes the material. For example, a first FDSOI transistor can have a buried dielectric layer of silicon nitride having a fixed positive charge and a second FDSOI transistor can have a buried dielectric layer of aluminum oxide having a fixed negative charge.

FIG. 1 illustrates an embodiment of the present semiconductor device including a first transistor I and a second transistor II, both having different threshold voltages. The first transistor I includes a gate 50 with sidewall insulators 52. The gate 50 is located on a channel layer 40 that connects a source 30 to a drain 32 located on either side of the gate 50. Optional epitaxial layers 34 can be located on the source 30 and the drain 32. Epitaxial layers 34 can raise the height of the respective source 30 and drain 32, often referred to as raised source and raised drain, respectively. The epitaxy layers 34 are typically doped with dopants by in-situ doped epitaxy process (dopants are incorporated in the epitaxy layers during epitaxy). Alternatively, dopants can be incorporated in the epitaxy layer 34 by any other suitable doping technique, including but not limited to, ion implantation, gas phase doping, plasma doping, plasma immersion ion implantation, cluster doping, infusion doping, liquid phase doping, solid phase doping, and/or any suitable combination of those techniques. In some embodiments, dopants are activated by thermal annealing such as laser annealing, flash annealing, rapid thermal annealing (RTA), or any suitable combination of those techniques. Utilizing a raised source and a raised drain can help reduce the resistance of source and drain and help alleviate process issues due to the thin source 30 and drain 32 layers. The first transistor I is located on the semiconductor substrate that includes a semiconductor layer 10 and a first fixed charge dielectric layer 20. Optional intermediate layers 12 and 14 can be located in between the semiconductor layer 10 and the first fixed charge dielectric layer 20 and in between the first fixed charge dielectric layer 20 and the gate 50, respectively.

The second transistor II includes a gate 150 with sidewall insulators 152. The gate 150 is located on a channel layer 140 that connects a source 130 to a drain 132 located on either side of the gate 150. Optional epitaxial layers 134 can be located on the source 130 and the drain 132. The second transistor II is located on the semiconductor substrate that includes the semiconductor layer 10 and a second fixed charge dielectric layer 120. Optional intermediate layers 12 and 14 can be located in between the semiconductor layer 10 and the second fixed charge dielectric layer 120 and in between the second fixed charge dielectric layer 120 and the gate 150, respectively. Although not shown, the structure in FIG. 1 can further comprise other structures such as contacts, interlevel dielectric, interconnects, wiring, etc.

The first fixed charge dielectric layer 20 and the second fixed charge dielectric layer 120 have different charges. For example, both the first fixed charge dielectric layer 20 and the second fixed charge dielectric layer 120 can be positively charged to different degrees, one layer having relatively more fixed positive charges than the other; both the first fixed charge dielectric layer 20 and the second fixed charge dielectric layer 120 can be negatively charged to different degrees, one layer having relatively more fixed negative charges than the other; or one of the first fixed charge dielectric layer 20 and the second fixed charge dielectric layer 120 can be positively charged and the other of the first fixed charge dielectric layer 20 and the second fixed charge dielectric layer 120 can be negatively charged.

The first fixed charge dielectric layer 20 and the second fixed charge dielectric layer 120 can each independently include silicon nitride, silicon oxide, silicon oxynitride, hafnium oxide, zirconium oxide, aluminum oxide, titanium oxide, lanthanum oxide, strontium titanate, lanthanum aluminate, hafnium silicon oxide, zirconium silicon oxide, or a combination including at least one of the foregoing, with the proviso that the first fixed charge dielectric layer 20 and the second fixed charge dielectric layer 120 are differently charged. In an aspect, one of the first fixed charge dielectric layer 20 and the second fixed charge dielectric layer 120 includes silicon nitride, which has a fixed, positive charge and the other of the first fixed charge dielectric layer 20 and the second fixed charge dielectric layer 120 includes aluminum oxide, which has a fixed, negative charge.

The respective fixed charge dielectric layers can be localized to the region below the respective transistor. For example, the respective fixed charge dielectric layers can be located in the area underneath the source, drain, and channel layer of the respective transistor.

An isolation region 16 can be located in between the first transistor I and the second transistor II. The isolation region 16 can be a trench isolation region or a field oxide isolation region. The isolation region 16 can be formed by methods known in the art, for example, by lithography, etching, and filling the trench with a trench dielectric. Optionally, a liner can be formed in the trench prior to trench fill, a densification process can be performed after the trench fill, and a planarization process can follow the trench fill.

FIGS. 2-5 illustrate various semiconductor device after fabrication operations have been performed in accordance with embodiments of the present invention. The semiconductor structures shown in FIGS. 2-5 represent selected portions of the semiconductor devices I and II shown in FIG. 1. The novel aspects of the invention can be applied to a wide range of planar and non-planar FET architectures that utilize the differently charged dielectric layers to effect a semiconductor device having transistors with different threshold voltages.

Figure 2:
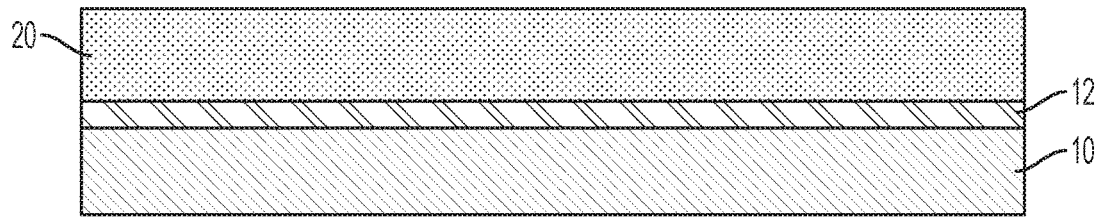

FIG. 2 illustrates that the first fixed charge dielectric layer 20 can be deposited on the semiconductor layer 10. The intermediate layer 12 can optionally be deposited prior to depositing the first fixed charge dielectric layer 20. The intermediate layer 12 can result in an improved adhesion of the first fixed charge dielectric layer 20 and the semiconductor layer 10. In some embodiments, the intermediate layer 12 can comprise silicon oxide formed by thermal oxidation or deposition. In embodiments of the invention, the first fixed charge dielectric layer 20 can be deposited using, for example, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), limited reaction processing CVD (LRPCVD), ultrahigh vacuum chemical vapor deposition (UHVCVD), metalorganic chemical vapor deposition (MOCVD), physical vapor deposition (PVD), sputtering, plating, evaporation, ion beam deposition, electron beam deposition, laser assisted deposition, chemical solution deposition, or any combination of those methods.

Figure 3:
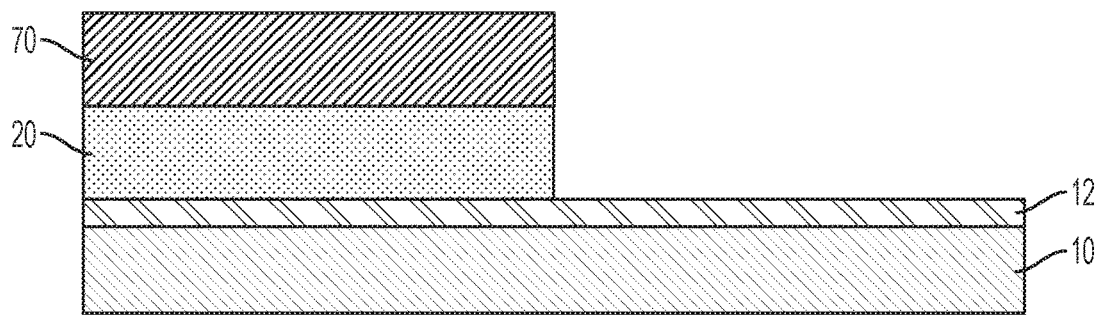

In FIG. 3, known fabrication operations are used to mask a portion of the first fixed charge dielectric layer 20 with a mask layer 70 and to remove a portion in the region where the second transistor II will be formed. Non-limiting examples of suitable etching processes include dry etch such as reactive ion etching, a remote plasma, or chemical vapor/sublimation. Alternatively, the etch process can be a wet etch with an aqueous solution.

Although not shown in FIG. 2, in some embodiments, after etching the first fixed charge dielectric layer 120 in the second region, the intermediate layer 12 in the second region is removed. Furthermore, a portion of the semiconductor layer 10 in the second region can be recessed so that we can create different thickness of fixed charge dielectric layers in the first region and in the second region.

Figure 4:
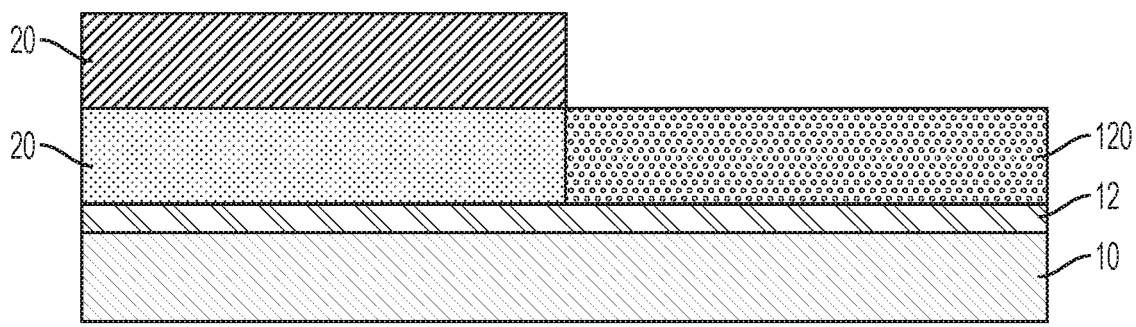

In FIG. 4, known fabrication operations are used to deposit the second fixed charge dielectric layer 120. In embodiments of the invention, the second fixed charge dielectric layer 120 can be deposited conformally using, for example, an atomic layer deposition process.

The thickness of the first fixed charge dielectric layer 120 and the second fixed charge dielectric layer 120 can each independently be 20 to 200 nanometers, specifically, 50 to 150 nanometers, specifically, 60 to 100 nanometers. The thickness of the first fixed charge dielectric layer 120 and the second fixed charge dielectric layer 120 can be different. The thickness of the first fixed charge dielectric layer 120 and the second fixed charge dielectric layer 120 can be same such that they form a conformal layer. For example, the thickness of the first fixed charge dielectric layer 120 and the second fixed charge dielectric layer 120 can be within 15%, specifically, within 5%, more specifically, within 1% of each other. In some embodiments, a new intermediate layer can be deposited before the deposition of the second fixed charge dielectric layer to get different thicknesses of the first and the second fixed charge dielectric layers.

Figure 5:
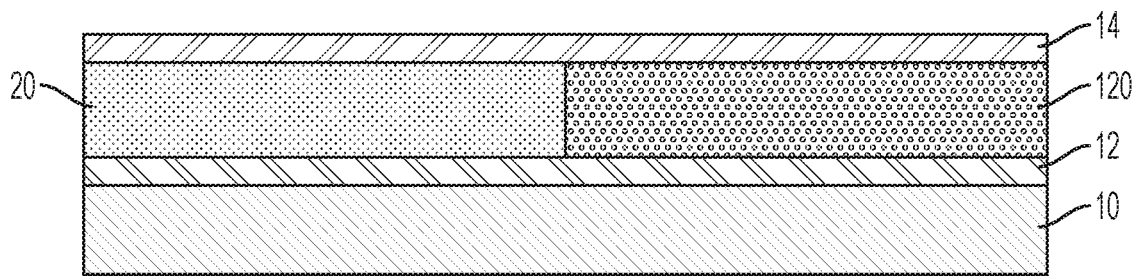

In FIG. 5, known fabrication operations are used to remove the mask layer 70 if present and to planarize a surface of the first fixed charge dielectric layer 20 and the second fixed charge dielectric layer 120. The surface can be planarized by chemical mechanical polishing (CMP). Intermediate layer 14 can optionally be deposited on the planarized surface. In some embodiments, the intermediate layer 14 comprises silicon oxide. It can be deposited by ALD, CVD, high temperature oxide deposition (HTO), low temperature oxide deposition (LTO), ozone/TEOS deposition, or any other suitable deposition method.

Intermediate layers 12 and 14 can each independently include at least one of silicon oxide, silicon oxynitride, a nitride semiconducting oxide, or a combination including at least one of the foregoing. Intermediate layers 12 and 14 can each independently be formed using known methods, for example, intermediate layer 12 can be formed by oxidation or oxynitridation. The intermediate layer 14 can be deposited by ALD, CVD, high temperature oxide deposition (HTO), low temperature oxide deposition (LTO), ozone/TEOS deposition, or any other suitable deposition method.

Intermediate layers 12 and 14 can each independently be 1 to 5 nanometers thick, specifically, 2 to 3 nanometers thick.

Figure 6:
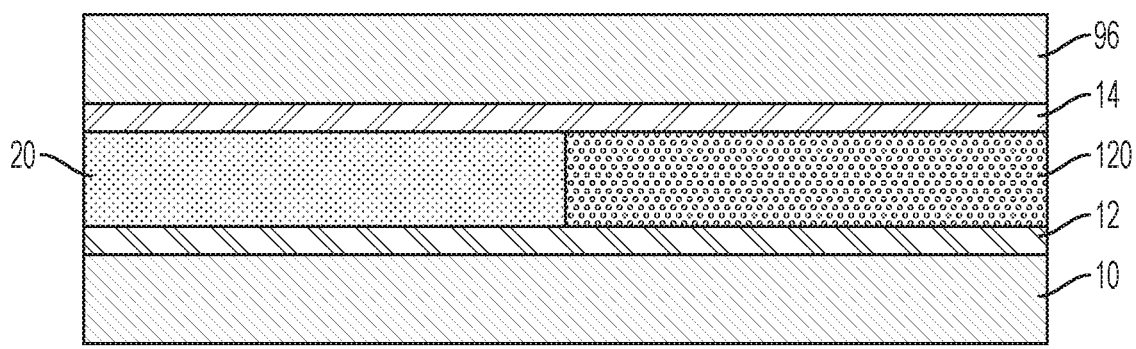
FIG. 6 is a cross-sectional view of the semiconductor structure addition of a second semiconductor substrate according to embodiments of the invention.

In FIG. 6, known fabrication operations are used to add a second semiconductor substrate 92 (e.g., silicon wafer) to the planarized surface to form semiconductor on insulator (SOI) structure. The second semiconductor substrate can be thinned to the desired thickness by any suitable methods, for example, a SmartCut™ process can be used. The resulted thickness of the semiconductor layer 92 can range from 3 nm to 20 nm, or 6 to 15 nm, or 10 to 12 nm.

Known fabrication operations can then be used to fabricate the transistors I and II on the front side of the surface to form the semiconductor device of FIG. 1.

The gates 50 and 150 can each comprise a gate dielectric and a gate conductor. Gate dielectric can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

The gate can comprise any suitable conductive material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

The gates can include one or more layers of each independently including silicon, aluminum, carbon, nitrogen, titanium, tantalum, tungsten, germanium, or a combination including at least one of the foregoing. For example, the one or more layers can each independently include titanium (Ti), titanium nitride (TiN), titanium-aluminum (TiAl), titanium aluminum nitride (TiAlN), titanium-aluminum-carbon (TiAlC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), tungsten, or a combination including at least one of the foregoing.

The semiconductor device can include one or more transistors including a gate 50, a gate 150, or a gate different from gate 50 and gate 150.

The gates can each independently include three or more layers (not shown). For example, the gate can include a lower gate portion, an upper gate portion, and a middle layer located in between the lower gate portion and the upper gate portion. The lower gate portion can include a work function metal (such as aluminum carbide, titanium aluminide, or titanium aluminum carbide). The upper gate portion can include tungsten, titanium, aluminum, or a combination including at least one of the foregoing. Specifically, the upper gate portion can include tungsten.

The middle layer can act as a barrier between the lower gate portion and the upper gate portion. The middle gate layer can include a metal nitrate. For example, the middle gate layer can include at least one of titanium aluminum nitride or titanium nitrate (TiN), specifically, titanium nitrate.

The gate material can be doped, for example, by an in-situ doping deposition process, ion implantation, or annealing. The gate material can be doped with As, P, B, Sb, Bi, In, Al, Ga, Ti, or a combination including at least one of the foregoing. The dopant can be present in the gate material in an amount of $1\times10^{14}$ to $1\times10^6$ atoms per centimeters squared (atoms/cm$^2$), specifically, $1\times10^{15}$ to $5\times10^{15}$ atoms per centimeters squared. The gate 50 and 150 can include different dopants, further enabling the formation of gates having different voltage thresholds.

The gate material that forms the gates can be deposited, for example, by atomic layer deposition, chemical vapor deposition, physical vapor deposition, chemical vapor deposition, evaporation, plating, etc.

The thickness, i.e., height, of the gates 50 and 150 can each independently be 20 to 180 nanometers, specifically, 40 to 150 nanometers. The gate can have a thickness of less than or equal to 10 nanometers, specifically, of 3 to 8 nanometers. The lower gate portion and the upper gate portion can each independently have a thickness of 0.5 to 7 nanometers, specifically, 0.5 to 2 nanometers. The middle layer can have a thickness of 1 to 7 nanometers, specifically, 2 to 5 nanometers.

A cap (also referred to herein as the gate cap) (not shown) and a sidewall layer 52 can be located on the respective gates. The cap can be located on an upper surface opposite from semiconductor layer 10 and the sidewall layer 52 and 152 can be located on the sides of the gate.

The cap and the sidewall layers 52 and 152 can each independently be an insulator and can include a material such as silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycarbonitride (SiOCN), silicon oxide, and combinations thereof. Spacers can be formed by any suitable techniques such as deposition followed by directional etch. Deposition may include but is not limited to, atomic layer deposition (ALD), chemical vapor deposition (CVD). Directional etch may include but is not limited to, reactive ion etch (RIE).

The respective source 30 and 130 and drains 32 and 132 can each independently include a heavily doped semiconductor material, for example, silicon or silicon germanium with a dopant concentration of $1\times10^{19}$ cm$^{-3}$ to $3\times10^{21}$ cm$^{-3}$, or $2\times10^{20}$ cm$^{-3}$ to $3\times10^{21}$ cm$^{-3}$, for example, with N-type dopants (e.g., phosphorus or arsenic) or p-type dopants (e.g., boron or gallium), depending on the type of transistor.

The channel layers 40 and 140 connect the respective sources to the respective drains and conduct when a threshold voltage is present on the gate structure. The channel layers 40 and 140 can each independently have a thickness of 3 to 10 nanometers. The channel layers 40 and 140 can each independently include a silicon (Si), germanium (Ge), silicon germanium (SiGe), silicon carbide (SiC), carbon doped silicon (Si:C), carbon doped silicon germanium (SiGe:C), gallium arsenide (GaAs), indium arsenide (InAs), and indium phosphide (InP), or a combination including at least one of the foregoing.

Semiconductor layer 10 can include a semiconducting material. Semiconductor layer 10 can include silicon, germanium, carbon, gallium, arsenic, indium, phosphorus, a remaining Group III or V compound, or a combination including at least one of the foregoing. Examples of semiconducting materials include silicon (Si), germanium (Ge), silicon germanium (SiGe), silicon carbide (SiC), carbon doped silicon (Si:C), carbon doped silicon germanium carbon (SiGe:C), gallium (Ga), gallium arsenide (GaAs), indium arsenide (InAs), and indium phosphide (InP). Semiconductor layer 10 can include an organic semiconductor or a layered semiconductor such as Si/SiGe, a semiconductor-on-insulator (such as silicon-on-insulator or a SiGe-on-insulator).

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. The term "or" means "and/or."

The terms "at least one" and "one or more" are understood to include any integer number greater than or equal to one, i.e. one, two, three, four, etc.

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon oxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon oxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators, and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    depositing a first fixed charge dielectric layer on a semiconductor layer;
    removing a portion of the first fixed charge dielectric layer to form an open area;
    depositing a second fixed charge dielectric layer on the open area;
    forming a first transistor on top of the first fixed charge dielectric layer; and
    forming a second transistor on top of the second fixed charge dielectric layer;
    wherein the first fixed charge dielectric layer and the second fixed charge dielectric layer are differently charged such that the first transistor and the second transistor have different threshold voltages.

2. The method of claim 1, wherein the first transistor and the second transistor are fully depleted silicon on insulator transistors.

3. The method of claim 1, wherein the first fixed charge dielectric layer and the second fixed charge dielectric layer comprise at least one of silicon nitride, silicon oxide, silicon oxynitride, hafnium oxide, zirconium oxide, aluminum oxide, titanium oxide, lanthanum oxide, strontium titanate, lanthanum aluminate, or a combination comprising at least one of the foregoing.

4. The method of claim 1, wherein at least one of the depositing the first fixed charge dielectric layer and the depositing the second fixed charge dielectric layer comprises depositing silicon nitride and the other of the depositing the first fixed charge dielectric layer and the depositing the second fixed charge dielectric layer comprises depositing aluminum oxide.

5. The method of claim 1, wherein the forming the first transistor and the forming the second transistor occur simultaneously.

6. The method of claim 1, wherein the forming the first transistor comprises depositing a first gate and the forming the second transistor comprises depositing a second gate and the first gate and the second gate comprise different materials.

7. The method of claim 1, further comprising planarizing a surface of the first fixed charge dielectric layer and the second fixed charge dielectric layer after depositing the second fixed charge dielectric layer to form a conformal dielectric layer.

8. The method of claim 1, further comprising depositing a first intermediate layer located on the semiconductor layer prior to depositing the first fixed charge dielectric layer and depositing a second intermediate layer after depositing the second fixed charge dielectric layer and prior to forming the first transistor.

9. The method of claim 1, wherein the first intermediate layer and the second intermediate layer comprise silicon oxide.

10. The method of claim 1 further comprising forming at least one additional transistor.

11. A method of forming a semiconductor device, the method comprising:

forming a first transistor on a first fixed charge dielectric layer, the first transistor comprising a first gate over a first channel layer, the first channel layer positioned between the first gate and the first fixed charge dielectric layer; and forming a second transistor on a second fixed charge dielectric layer, the second transistor comprising a second gate over a second channel layer, the second channel layer positioned between the second gate and the second fixed charge dielectric layer;

wherein the first fixed charge dielectric layer comprises a fixed positive charge and the second fixed charge dielectric layer comprises a fixed negative charge.

12. The method of claim 11 wherein the first fixed charge dielectric layer and the second fixed charge dielectric layer are differently charged such that the first transistor and the second transistor have different threshold voltages.

13. The semiconductor device of claim 11, wherein the first transistor and the second transistor comprise fully depleted silicon on insulator transistors.

14. The semiconductor device of claim 11, wherein the first fixed charge dielectric layer and the second fixed charge dielectric layer comprise at least one of silicon nitride, silicon oxide, silicon oxynitride, hafnium oxide, zirconium oxide, aluminum oxide, titanium oxide, lanthanum oxide, strontium titanate, lanthanum aluminate, hafnium silicon oxide, zirconium silicon oxide, or a combination comprising at least one of the foregoing.

15. The semiconductor device of claim 11, wherein one of the first fixed charge dielectric layer and the second fixed charge dielectric layer comprises silicon nitride and the other of the first fixed charge dielectric layer and the second fixed charge dielectric layer comprises aluminum oxide.

16. The semiconductor device of claim 11, wherein the first fixed charge dielectric layer and the second fixed charge dielectric layer form a conformal layer on a semiconductor layer.

17. The semiconductor device of claim 11, further comprising a first intermediate layer located between a semiconductor layer and the first fixed charge dielectric layer and a second intermediate layer located between the first fixed charge dielectric layer and the first channel layer.

18. The semiconductor device of claim 17, wherein the first intermediate layer and the second intermediate layer comprise silicon oxide.

* * * * *